(12) United States Patent
Bryant et al.

(10) Patent No.: US 7,709,313 B2
(45) Date of Patent: May 4, 2010

(54) HIGH PERFORMANCE CAPACITORS IN PLANAR BACK GATES CMOS

(75) Inventors: Andres Bryant, Burlington, VT (US); Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 11/160,999

(22) Filed: Jul. 19, 2005

(65) Prior Publication Data
US 2007/0020837 A1    Jan. 25, 2007

(51) Int. Cl.
*H01L 21/8238* (2006.01)

(52) U.S. Cl. .................. 438/199; 436/76; 436/146; 436/175; 436/176; 436/177; 436/244; 436/262; 436/282; 436/283; 436/284; 436/370; 436/387; 436/388; 436/389; 257/E21.623; 257/E21.637

(58) Field of Classification Search .............. 438/157, 438/283, 199, 176; 257/E21.623, E21.637
See application file for complete search history.

(56) References Cited

U.S. PATENT DOCUMENTS

| | | | | |
|---|---|---|---|---|
| 4,853,342 A * | 8/1989 | Taka et al. | ................ | 438/283 |
| 5,441,899 A * | 8/1995 | Nakai et al. | ................ | 438/766 |
| 5,510,276 A * | 4/1996 | Diem et al. | .................. | 438/53 |
| 5,580,802 A * | 12/1996 | Mayer et al. | ............... | 438/157 |
| 5,770,881 A * | 6/1998 | Pelella et al. | .............. | 257/347 |
| 5,880,030 A * | 3/1999 | Fang et al. | ................. | 438/701 |
| 5,978,294 A * | 11/1999 | Ueno et al. | ................. | 365/149 |
| 6,069,819 A * | 5/2000 | Tiwari | ........................ | 365/149 |
| 6,191,007 B1 * | 2/2001 | Matsui et al. | .............. | 438/459 |
| 6,248,626 B1 * | 6/2001 | Kumar et al. | .............. | 438/257 |
| 6,342,717 B1 * | 1/2002 | Komatsu | ................... | 257/347 |
| 6,383,904 B1 * | 5/2002 | Yu | .............................. | 438/589 |
| 6,391,695 B1 * | 5/2002 | Yu | .............................. | 438/166 |
| 6,403,981 B1 * | 6/2002 | Yu | ................................ | 257/63 |
| 6,423,599 B1 * | 7/2002 | Yu | .............................. | 438/283 |
| 6,458,638 B2 * | 10/2002 | Kim | ........................... | 438/157 |
| 6,596,570 B2 * | 7/2003 | Furukawa | ................... | 438/162 |
| 6,664,598 B1 * | 12/2003 | Dennard et al. | ............ | 257/347 |
| 6,686,630 B2 * | 2/2004 | Hanafi et al. | ................ | 257/366 |
| 6,759,283 B2 * | 7/2004 | Yasuda et al. | ............... | 438/149 |
| 6,800,518 B2 * | 10/2004 | Bendernagel et al. | ....... | 438/207 |
| 6,815,296 B2 * | 11/2004 | Dennard et al. | ............ | 438/283 |

(Continued)

FOREIGN PATENT DOCUMENTS

JP        06275826     *  9/1994

(Continued)

OTHER PUBLICATIONS

Chinese Office Action for related Chinese Application No. 2006800264272 dated May 22, 2009.

*Primary Examiner*—Fernando L Toledo
*Assistant Examiner*—Ankush K Singal
(74) *Attorney, Agent, or Firm*—Anthony J. Canale; Greenblum & Bernstein P.L.C.

(57) ABSTRACT

A method of manufacture and device for a dual-gate CMOS structure. The structure includes a first plate in an insulating layer and a second plate above the insulating layer electrically corresponding to the first plate. An isolation structure is between the first plate and the second plate.

32 Claims, 8 Drawing Sheets

U.S. PATENT DOCUMENTS

| | | | | |
|---|---|---|---|---|
| 6,833,569 | B2* | 12/2004 | Dokumaci et al. | 257/250 |
| 6,855,969 | B2* | 2/2005 | Inoh | 257/250 |
| 7,009,251 | B2* | 3/2006 | Furukawa | 257/349 |
| 7,015,547 | B2* | 3/2006 | Hackler et al. | 257/347 |
| 7,057,926 | B2* | 6/2006 | Ohsawa | 365/177 |
| 7,087,475 | B2* | 8/2006 | Inoh | 438/197 |
| 7,119,385 | B2* | 10/2006 | Usuda et al. | 257/250 |
| 7,129,138 | B1* | 10/2006 | Furukawa et al. | 438/294 |
| 7,265,005 | B2* | 9/2007 | Nowak et al. | 438/176 |
| 7,273,785 | B2* | 9/2007 | Dennard et al. | 438/262 |
| 7,335,932 | B2* | 2/2008 | Anderson et al. | 257/288 |
| 2002/0105039 | A1* | 8/2002 | Hanafi et al. | 257/401 |
| 2002/0185684 | A1 | 12/2002 | Campbell et al. | |
| 2003/0168677 | A1* | 9/2003 | Hsu | 257/239 |
| 2003/0207545 | A1 | 11/2003 | Yasukawa | |
| 2004/0121549 | A1* | 6/2004 | Dokumaci et al. | 438/283 |
| 2004/0126985 | A1* | 7/2004 | Bendernagel et al. | 438/411 |
| 2004/0157396 | A1 | 8/2004 | Lee et al. | |
| 2004/0222471 | A1 | 11/2004 | Inoh | |
| 2005/0026353 | A1* | 2/2005 | Bhattacharyya | 438/232 |
| 2005/0037582 | A1* | 2/2005 | Dennard et al. | 438/281 |
| 2005/0048703 | A1* | 3/2005 | Dennard et al. | 438/149 |
| 2005/0087804 | A1* | 4/2005 | Furukawa | 257/347 |
| 2005/0158933 | A1* | 7/2005 | Inoh | 438/197 |
| 2006/0022264 | A1* | 2/2006 | Mathew et al. | 257/331 |
| 2006/0105529 | A1* | 5/2006 | Lee | 438/283 |
| 2006/0255414 | A1* | 11/2006 | Appenzeller et al. | 257/401 |
| 2006/0284236 | A1* | 12/2006 | Bhattacharyya | 257/314 |
| 2007/0120200 | A1* | 5/2007 | Yun | 257/401 |
| 2008/0036000 | A1* | 2/2008 | Anderson et al. | 257/347 |
| 2009/0010056 | A1* | 1/2009 | Kuo et al. | 365/184 |

FOREIGN PATENT DOCUMENTS

JP      08-222701      8/1996

* cited by examiner

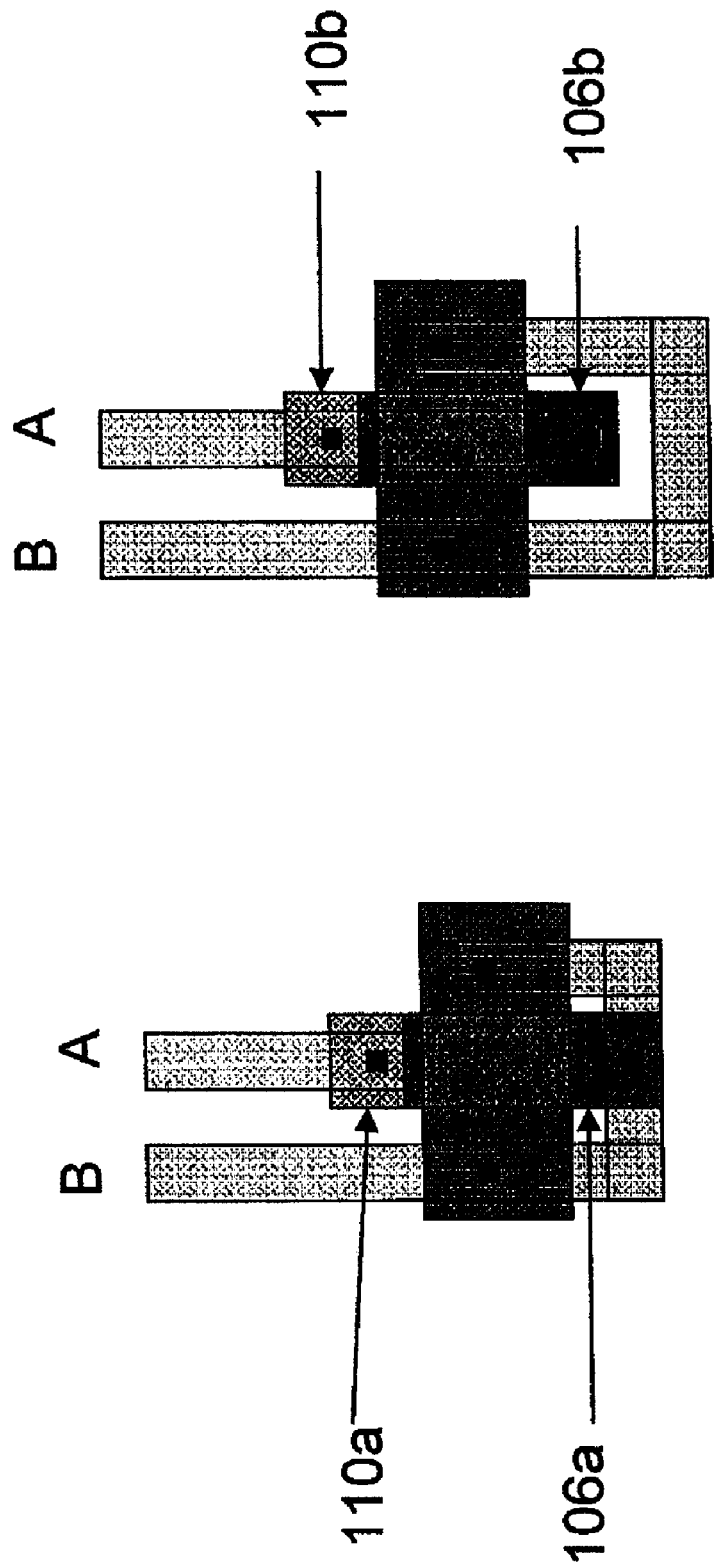
A: FET Capacitor
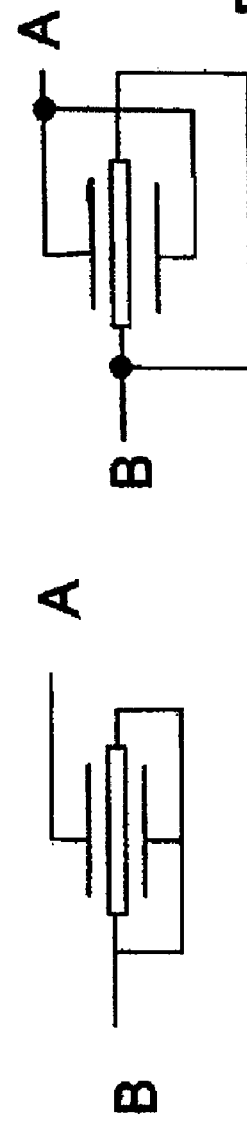
B: High Density Capacitor
Figure 6a
Figure 6b

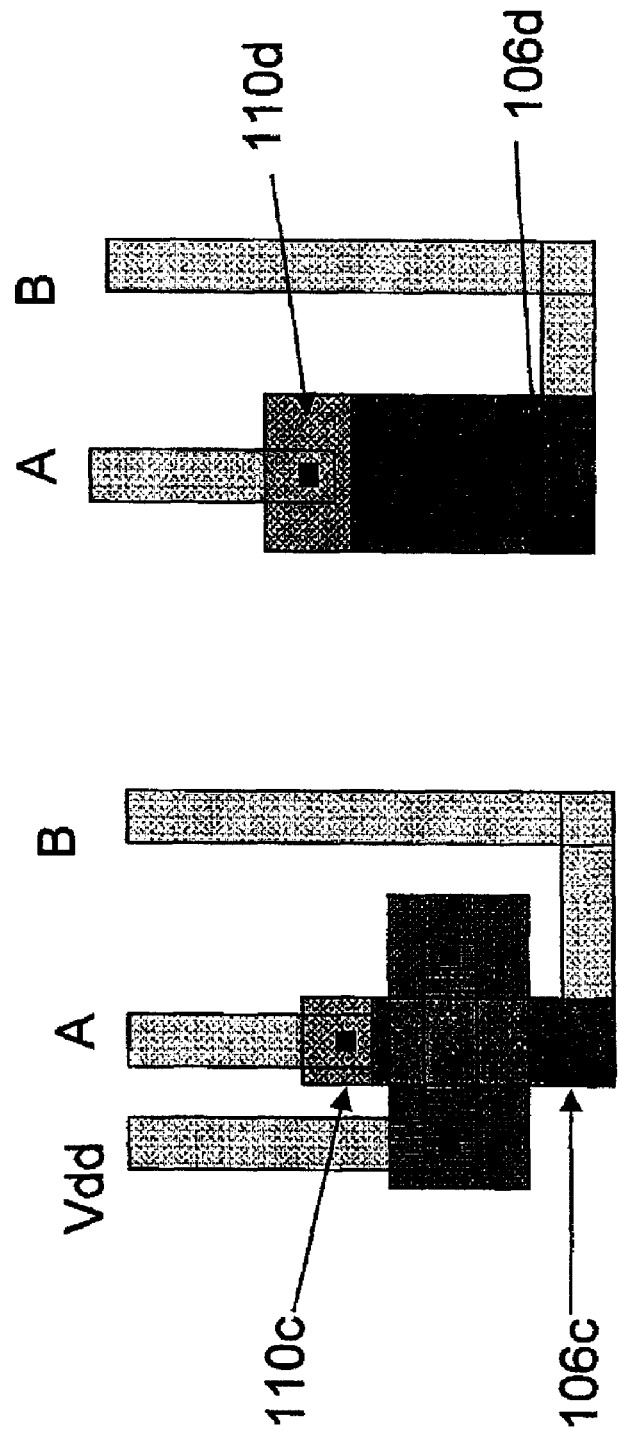
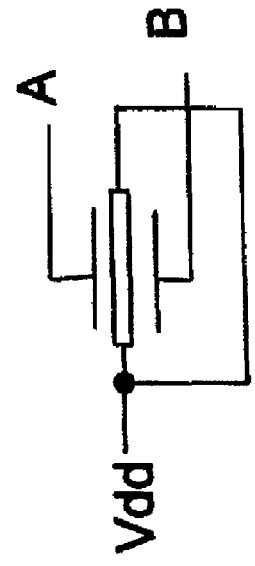
Figure 6d — D: Dual gate capacitor
Figure 6c — C: FD Capacitor

HIGH PERFORMANCE CAPACITORS IN PLANAR BACK GATES CMOS

FIELD OF THE INVENTION

The invention relates to semiconductor devices, and more particularly to ultra-thin SOI based dual-gate CMOS capacitors and method of manufacture.

BACKGROUND DESCRIPTION

A conventional MOS (metal-oxide semiconductor) capacitor can be modeled as a parallel plate capacitor. In this type of structure, one plate may be made from a metal or a heavily-doped polycrystalline silicon ("poly") and one plate may be made from a semiconductor (e.g., the inversion layer formed when the MOS capacitor is under high forward bias). An insulator such as $SiO_2$ or "oxide", for example, may be used to separate the two plates. In deeply scaled ultra-thin SOI (silicon on insulator) devices, the insulation layer, e.g., oxide, beneath the source and drain regions, is made thinner to improve MOS transistor performance. Although this results in a faster transistor, the thinner channel region and dopant solid solubility limits the amount of active dopants that can be placed in the channel. This results in the effective series resistance becoming quite large in the capacitor. This may pose many problems from a circuit standpoint.

More specifically, in ultra-thin SOI MOS devices, the n-channel FET of the nMOS transistor is made of p-type silicon, and the p-channel FET of the pMOS transistor is made of n-type silicon. Heavily-doped source and drain regions provide electrodes to contact the previously mentioned channel region. In an SOI MOS device, an oxide region is created beneath the channel. The oxide region electrically isolates the source, drain, and channel regions of device from the substrate. The MOS threshold voltage of the channel, i.e., the gate potential when charge carriers can flow through the channel from the source to the drain in significant quantities, is determined by factors such as the work function of the gate, any channel dopants, and the dimensions of the transistor structure. However, low mobile channel charge in a SOI MOS device can under certain conditions have large effective resistance (equivalent serial resistance (ESR)). This large ESR has a great influence on the performance of the capacitor. For example, an increase in the effective resistance of the capacitor will result in worsening frequency characteristics of the capacitor.

A more detailed model of the MOS structure decomposes the vertical gate-dielectric-substrate gate "stack" into two capacitors in series, e.g., a linear oxide capacitance and a nonlinear channel capacitance. By way of example, if the voltage on the gate is strongly negative on an N-type MOS structure, holes are attracted to the dielectric-substrate interface and accumulate there. In the accumulation regime, MOS capacitors act approximately as linear capacitors. On the other hand, if the gate voltage is made positive on an N-type MOS structure, the surface is depleted of mobile holes, creating a depleted region with exposed dopant ions. The depletion capacitance is nonlinear due to the approximately square root dependence of the depletion charge on potential under the gate dielectric. But, as the gate voltage is raised further, the potential barrier between the source terminal and the channel is lower electrostatically and the channel is flooded with mobile electrons from the source. It is the presence of electrons in channel that indicates the inversion of the silicon near the surface, e.g., an NFET channel becomes n-type and analogously a PFET channel becomes p-type.

In the ultra-thin SOI devices, the depth of the silicon region beneath the gate stack is made very thin due to transistor scaling rules, where the bottom of the silicon region beneath the gate is bounded by the buried oxide. Even at channel doping levels near the solid solubility limit, the depletion region induced by the gate can extend from the gate to the back oxide creating a region that is depleted of mobile carriers, (i.e., "fully depleted").

Weak inversion results when the number of mobile electrons (the inversion charge) is much lower than the number of exposed dopant ions in the depletion region (the depletion charge). On the other hand, strong inversion results when the inversion charge greatly exceeds the depletion charge. Also, the transition between strong inversion to moderate inversion can be defined as the condition when the inversion charge and the depletion charge are comparable. When the channel area under the gate is strongly inverted, the gate charge is balanced out primarily by the inversion layer charge. The voltage at which inversion layer charge dominates is called the threshold voltage Vt and $Vt_0$ indicates the threshold voltage when the source voltage equals zero.

In SOI MOS technologies, there are several modes of operation depending on the application of an external bias to the SOI channel region (also referred to as the silicon body). The silicon body is isolated from the substrate by the buried back oxide. This case, the floating body case, the potential in the body is controlled by many physical factors including diode junction currents from the source and drain, impact ionization near the drain, gate leakage, bipolar effects, and capacitive coupling to the device's electrical terminals the gate, source, drain, and body. An SOI body potential can be defined relative to the source potential and the body potential can be significantly forward-biased with respect to the source potential during normal operation. If an external potential is applied to the SOI body (called a body contact), the body potential is constrained by the external potential and the resistance between the external body contact and the SOI body. Note however that in the case of an ultra-thin SOI device with a silicon body that has been scaled to the point where it is fully-depleted, the external resistance can be so high that the body contact is ineffective.

An extension of the ultra-thin SOI MOS device described above is the dual-gate SOI MOS transistor. In this structure, the back oxide have been thinned to the point that the region below the back oxide can exert non-negligible electrical field on the body and possibly form for an inversion layer or accumulation layer adjacent to the back oxide. When a second gate electrode is placed in or beneath the back oxide, a dual-gate device SOI MOS transistor is formed. Furthermore the second gate electrode (the back gate) is typically isolated from other electrically conductive elements such as the substrate, source, drain, and top gate (front gate).

In conventional MOS process technologies such as SOI or bulk (non-SOI) intentional capacitor circuit elements can be created without significant extra process steps by using a regular MOS transistor that is biased in the inversion or accumulation regime. This gives a relative constant high value capacitor due to the usage of the regular MOS gate oxide. These capacitors can function as decoupling capacitors or as reactive elements in analog applications. However in dual gate ultra-thin SOI the intentional capacitive element formed in this manner can contain parasitic resistance that is dominated by the fully-depleted body in some ranges of operation, reducing it usefulness as a circuit design element. However, traditional and leading-edge circuit design techniques still have a need for intentional capacitive elements, since dual-gate SOI has certain performance advantages over ultra-thin single gate SOI technologies Therefore it is desirable to introduce intentional capacitive circuit elements into dual-gate technologies that are low in parasitic resistance, have high capacitance, and are easy to fabricate.

SUMMARY OF THE INVENTION

In a first aspect of the invention, a method of manufacturing a dual-gate CMOS structure includes forming a first plate in an insulating layer and forming a second plate above the insulating layer electrically corresponding to the first plate. The method further includes providing an isolation structure between the first plate and the second plate.

In another aspect of the invention, the method of manufacturing a dual-gate CMOS structure includes forming at least one back plate in an insulating layer and forming at least one front plate above the insulating layer corresponding to the at least one back plate. The method further includes providing a dielectric between the at least one back plate and the front plate.

In yet another aspect of the invention, a capacitor formed on a substrate having a buried insulator layer and a device layer on the insulator layer comprises a lower plate formed in a buried insulator layer. A portion of the buried insulator layer is formed on the lower plate to provide a first capacitor dielectric. A portion of a device layer is formed on the first capacitor dielectric and a second capacitor dielectric is formed on the portion of the device layer. An upper plate is formed on the second capacitor dielectric.

In another aspect, the invention includes a dual-gate capacitor having at least one back gate formed in a buried insulator layer and at least one front gate formed above the buried insulator layer. A dielectric layer is formed between the at least one front gate and back gate. Diffusion regions are doped adjacent to the at least one back gate.

BRIEF DESCRIPTION OF THE DRAWINGS

FIGS. 6a-6d show top views or wiring schematics of the different structures of the invention, manufactured in accordance with the steps of the invention.

DETAILED DESCRIPTION OF EMBODIMENTS OF THE INVENTION

The invention is directed to CMOS structures and more particularly to low resistance, high value capacitors in scaled dual-gate SOI and a method of manufacture. By using the dual-gate device and method of fabrication of the invention, ultra-thin SOI capacitors with enhanced functionality are achieved. By way of example, in one application series resistance can be lowered for high frequency operations; whereas, in other applications, high capacitance can be achieved per unit area.

In accordance with the invention, four distinct CMOS capacitor structures may be manufactured simultaneously, if desired, based on scaled dual-gate SOI technology; namely, the initial structures may be formed with substantially the same processes, with different wiring structures to obtain desired results. In one application, two structures are designed to provide high capacitance directly between front and back gates with negligible reduction in series resistance. In another structure, for example, higher capacitance is provided with reduced series resistance by using both front and back gates electrically tied together, with the active silicon neither inverted or accumulated, thus providing a capacitive element vertically between the two plates and through the fully-depleted channel region.

Figure 1:
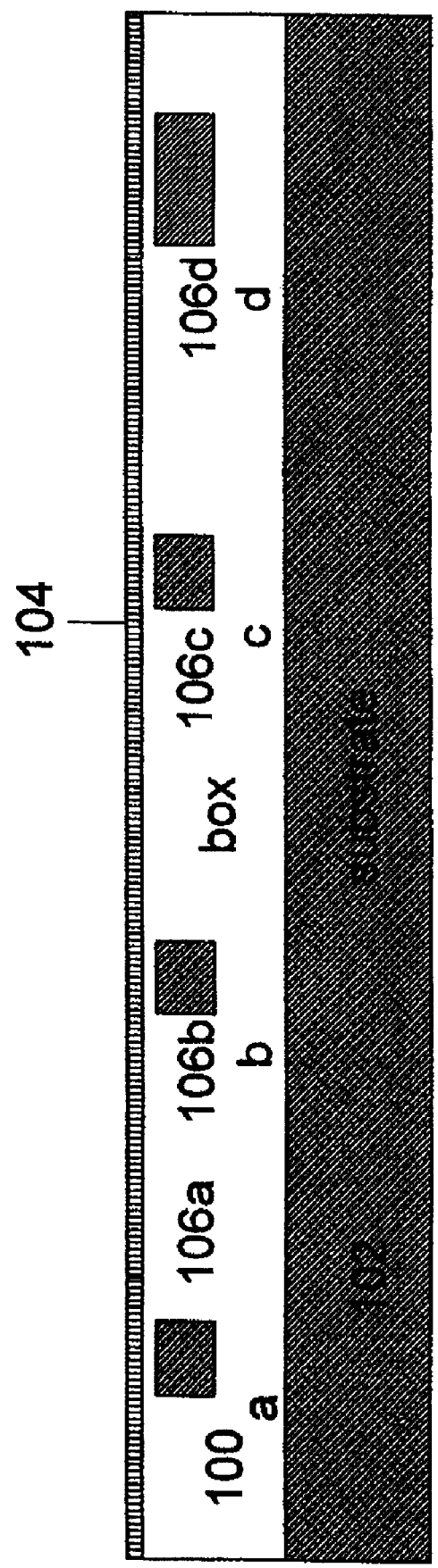
FIG. 1 illustrates steps in manufacturing a device in accordance with the invention.

FIG. 1 shows a beginning structure in accordance with the invention. In this structure, an oxide or dielectric layer 100 may be formed on a substrate 102, using any conventional methods. One such conventional method may include wafer bonding, where another wafer (not shown) with the oxide layer 100 is bonded to the substrate by van der Waals forces. The substrate wafer 102 may be comprised of silicon, germanium, or other readily known materials, and is preferably approximately 500 microns in thickness for purposes of manufacturing processes. A thin layer of silicon 104 is provided on the surface of the oxide layer 100. The silicon layer 104, in one embodiment, is approximately 50 Å to 400 Å thick, with other dimensions contemplated by the invention. FIG. 1 displays all embodiments in close proximity however this is not a requirement for application and one or more embodiments can be placed in arbitrary locations around the chip area.

Prior to the bonding the layers 100, 102, one or more back gates 106a-106d (also known as plates) are formed in the oxide layer. It should be understood that each back gate 106a-106d may be used to form a similar or different capacitor, depending on the wiring structure desired for a particular application. For example, in the embodiment shown in FIG. 1, the four back gates 106a-106d form structures in regions, a-d, respectively. Additionally, more or less than four back gates may also be formed, again depending on the desired application. Accordingly, it should be understood that the discussion of back gates 106a-106d are exemplary and should not be considered a limiting feature of the invention.

In forming the back gates 106a-106d, process steps including conventional standard lithographic and etching processes may be utilized, all known to those of skill in the art. For example, the process may include block masks used in combination with Reactive Ion Etching (RIE), in certain applications. In implementation, the back gates 106a-106d may be polysilicon and conventionally doped, for example, using phosphorous, boron or arsenic. Also, in embodiments, the cross-section of the back gates 106a-106d are of such dimensions so as to minimize any significant gate resistance. For example, the height of the back gates 106a-106d may be approximately 1000 Å to 2000 Å, although other critical dimensions are also contemplated by the invention. A space of approximately 10 Å to 100 Å is provided between the top surface of the oxide layer 100 and the back gates 106a-106d. This distance demarcates a region that can be referred to as the back gate oxide or dielectric layer, which can be sized to minimize any potential parasitic effects such as direct tunneling currents.

Figure 2:
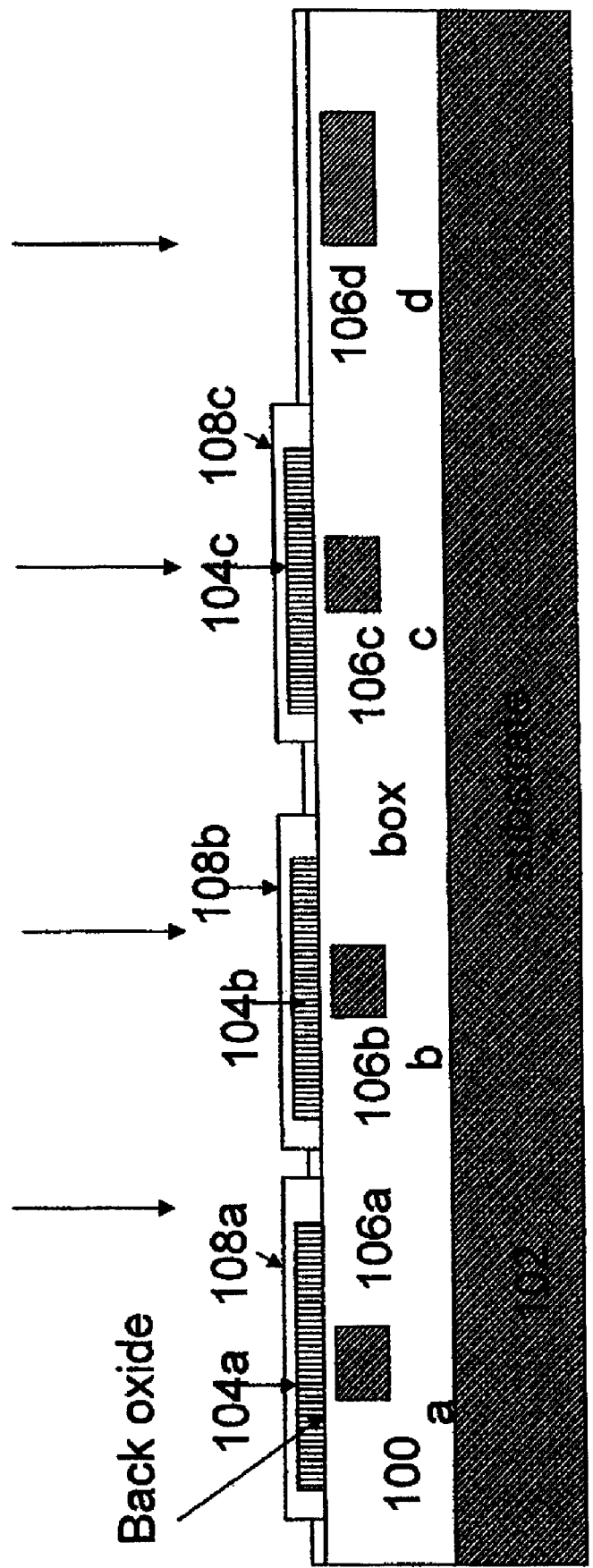
FIG. 2 illustrates additional steps in manufacturing the device in accordance with the invention.

FIG. 2 represents further processing steps in accordance with the invention. In FIG. 2, the silicon layer 104 is etched away, using conventional processes. For example, FIG. 2 is illustrative of an active area mask that is used to define each isolated capacitor element, which may include channel, drain, and source regions. In one application, the active area mask is placed over regions represented as "a", "b" and "c". The structure is then etched in a silicon isolation process, resulting in silicon bodies or islands 104a, 104b and 104c. The silicon layer 104 may be completely etched in the region "d".

Gate oxide or dielectric layers 108a, 108b, 108c are then thermally grown or deposited on the silicon bodies 104a, 104b, and 104c, respectively. In one embodiment, the gate oxide layers 108a, 108b, 108c are formed to a thickness of approximately 10 Å to 100 Å, similar to the spacing of the oxide layer 100 between the back gates 106a-106d and the silicon layer 104. This oxide layer may be used to form the actual capacitor(s) of the invention.

Figure 3:
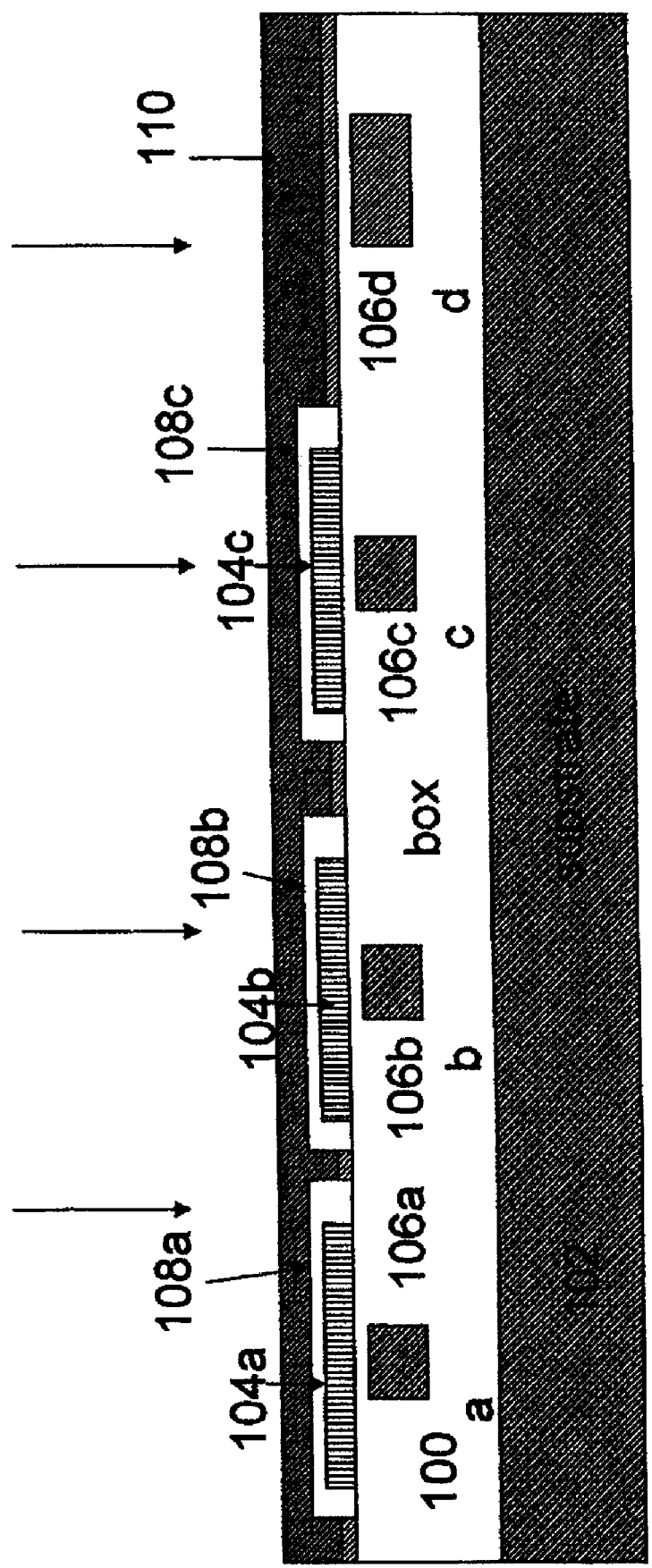
FIG. 3 illustrates additional steps in manufacturing the device in accordance with the invention.

FIG. 3 is representative of a gate material 110 (e.g., polysilicon) being deposited on the structure of FIG. 2. This material 110 is used to form the front gates, using subsequent steps described below. The gate material 110 may be heavily doped (e.g., $10^{20}$ cm$^{-3}$) however not necessarily the same dopant species is used with the back gates 106a-106b. High dopant levels of species such as phosphorous, boron or arsenic are used to minimize polysilicon depletion effects. The considerations for the dimensions of the polysilicon material 110 are also substantially the same as that of the back gates 106a-106c. For example, the cross section of the poly material 110 is of such dimensions so as to minimize any significant gate resistance, e.g., approximately 1000 Å to 2000 Å, although other critical dimensions are also contemplated by the invention.

Figure 4:
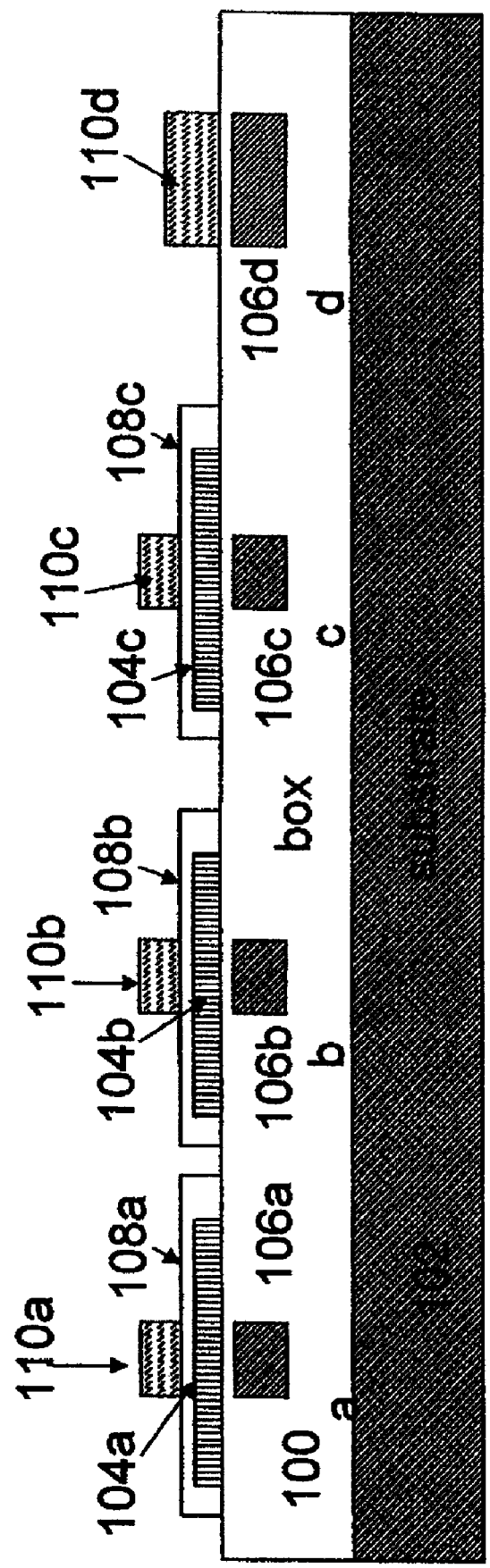
FIG. 4 illustrates additional steps in manufacturing the device in accordance with the invention.

FIG. 4 is illustrative of an exemplary patterning and etching process in order to form the front gates 110a-110d. In one process, the formation of the front gate 110d of section "d" may be formed separately from that of the remaining front gates 110a-110c. This is due to the front gate 110d being etched more deeply since the silicon layer 104 and subsequent oxide layer is not provided over this region. In one example, a protecting mask may be placed over region "d" during the processes forming the front gates 110a-110c. Likewise, a protecting mask may be placed over regions "a", "b" and "c", during the formation of the front gate 110d. These processes are well known in the art to those of skill such that further discussion is not required herein for a complete understanding of the invention.

Figure 5:
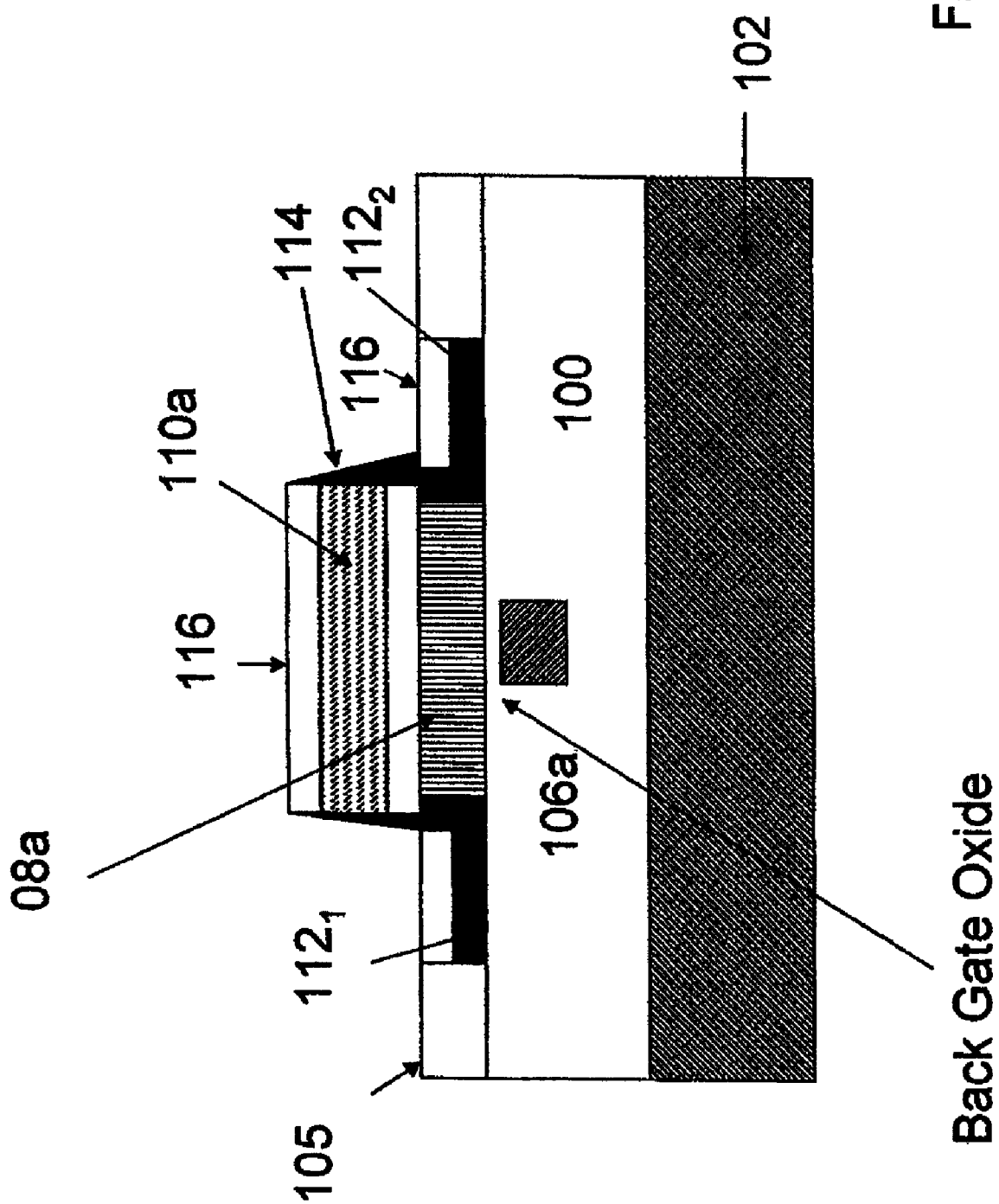
FIG. 5 illustrates additional steps in manufacturing the device in accordance with the invention.

FIG. 5 illustrates several processing steps including the formation of spacers, source and drain regions and silicide. In the illustration of FIG. 5, only the CMOS structure for region "a" is shown; however, it should be understood that the processes discussed with reference to section "a" are equally applicable for the formation of the structures in regions "b", "c" and "d". Accordingly, the exemplary illustration of FIG. 5 can be used for the formation of the source, drain, sidewalls and silicide formations on any of the structures shown in FIGS. 6a-7.

By way of example, referring to region "a", the source and drain regions $112_1$ and $112_2$, are formed in the silicon body in any conventional manner. An isolation region 105 is adjacent the source and drain regions $112_1$ and $112_2$. Spacers 114 are formed on the sidewalls of the front gate 110a and the front oxide layer 108a, extending to the doped source and drain regions $112_1$ and $112_2$, respectively. These regions can be doped using phosphorous, boron or arsenic, preferably resulting in the range of $1\times10^{20}$ particles/cm$^3$ for the source and drain, but typically lower levels for other doped regions such as halo or extension implants that may be part of the conventional transistor process into which the dual-gate MOS capacitor is being included. A silicide layer 116 is formed on the exposed silicon layer at the doped source and drain regions $112_1$ and $112_2$, respectively, in addition to a top surface of the front gate 110a. The formation of the silicide and spacers are well known in the art by those of skill in the art.

FIGS. 6a-6d show top views of wiring schematics of the different structures "a" through "d" described with reference to FIGS. 1-5. In FIG. 6a, a dual-gate FET capacitor is shown, corresponding to the manufacturing processes described for section "a". In the FET capacitor of FIG. 6a, a first wire "A" contacts the front gate 110a and forms a first terminal of the capacitor. A second wire "B" contacts the back gate 106a, in addition to both opposing sides of the silicon layer, and forms the second terminal of the capacitor. Thus, in this structure, the capacitor is formed from the "A" electrode, through the structure to the "B" electrode, which results in the source and drain shorted together. Alternatively, the roles of the back gate and the front gate can be reversed, with the "B" electrode consisting of the back gate and the "A" terminal consisting to the diffusion regions tied to the front gate.

FIG. 6b is a dual-gate capacitor using the structure formed in region "b" of FIGS. 1-5, with the wiring schematic shown herein. In the high-density capacitor of FIG. 6b, a first wire "A" contacts both sides of the silicon layer diffusion regions and forms a first terminal of the capacitor. A second wire "B" contacts the front gate 110b and the back gate 106b and forms the second terminal of the capacitor. Thus, in this structure, the wire "A" ties together the two sides of the silicon, while the wire "B" ties together the front gate 110b and the back gate 106b. The device of FIG. 6b provides increased capacitance as the device of FIG. 6a due to the front and back channel charge regions functioning electrically together.

In the capacitor structure of FIGS. 6a and 6b, high capacitance is possible because of the thin dielectric layer (a process step that is potentially shared with the conventional MOS transistor process that includes these dual-gate capacitors) directly between the front and back gates 106a and 110a, respectively. Also, since the outer edges (diffusions) of the silicon are connected together by wire "B", the top portion of the structure looks similar to a conventional MOSFET. And, in this case, an inversion layer can be formed beneath the top oxide layer 108a. That is, the dual-gate structure also allows both devices to have an inversion channel forms under the oxide layer 108a.

Also, accumulation or diffusion effects can occur since the front gate is formed over the silicon and there are two diffusions wired out at an electrically different potential from the front gate. Thus, as should be understood by this wiring schematic, if the potential of the "B" wire goes above the front or back gate threshold voltage with respect to the diffusion, an inversion layer will form; whereas, if the potential of the wire "B" has low enough bias with respect to the diffusion potential, an accumulation layer will occur under one or both of the capacitor oxides. It is recognized that opposite biasing results occur in p-type and n-type devices.

FIG. 6c is a dual-gate capacitor using the structure formed in region "c" of FIGS. 1-5, with the wiring schematic shown herein. In the wiring structure of FIG. 6c, a first wire "A" contacts the front gate 110c and forms a first terminal of the capacitor. A second wire "B" contacts the back gate 106c and forms the second terminal of the capacitor. A high potential (for example Vdd) contacts both sides (diffusions) of the silicon layer. From an electrical standpoint, the thin-body structure of FIG. 6c is fully-depleted and has field lines substantially penetrating the structure from "A" to "B", e.g., the front gate 110c to the back gate 106c. The dual-gate capacitor of FIG. 6c offers low series resistance for high-frequency operation (similar to that of FIG. 6d).

In the device of FIG. 6c, an inversion layer cannot form because the potential on the gate does not exceed the potential of the diffusion. An inversion layer may form when the gate potential, relative to one of the outside diffusion potentials, is above a MOS FET threshold and there is a source of carriers around, which is the source and drain. But, this is not desirable due to resistance issues. This phenomenon is eliminated in the device of FIG. 6c since the potential on the diffusions is high and the potentials on "A" and "B" are operated below that potential. Also, an accumulation can occur if the gate terminal goes too low; however, the assumption is that the device of FIG. 6c is operated so that this does not occur since there is roughly 1.2 volts (or the bandgap potential) between the high diffusion potential and the bias where accumulation would occur.

FIG. 6d is a gate capacitor using the structure formed in region "c" of FIGS. 1-5, with the wiring schematic shown herein. In the capacitor of FIG. 6d, a first wire "A" contacts the front gate 110d and forms a first terminal of the capacitor. A second wire "B" contacts the back gate 106d and forms the second terminal of the capacitor. The device of FIG. 6d offers low series resistance for high-frequency operations and high capacitance per unit area based on scaling of the back oxide thickness.

Figure 7:
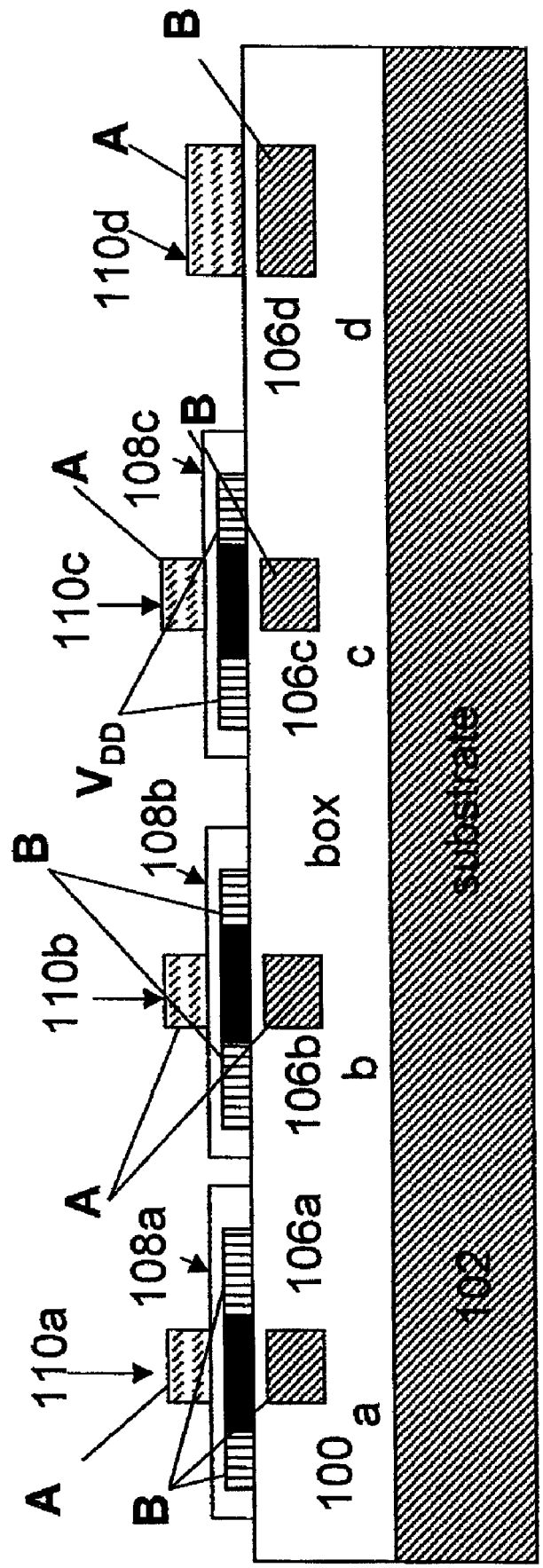
FIG. 7 shows a side view of the respective structures of FIGS. 6a-6d.

FIG. 7 shows a side view of the respective structures of FIGS. 6a-6d. The first wire "A" and the second wire "B" are representative of the respective terminals of the devices shown in FIGS. 6a-6d. FIG. 7 also clearly illustrates the regions "a", "b", "c" and "d" representative of the devices shown and described in FIGS. 6a-6d, respectively. In this illustration, two dielectric or oxide layers separate the front gates 110a-110c and the back gates 106a-106c. A contribution to parasitic resistance, direct tunneling through either the front or back gate is controlled by selecting the appropriate oxide thickness such that leakage current is minimized.

While the invention has been described in terms of exemplary embodiments, those skilled in the art will recognize that the invention can be practiced with modifications and in the spirit and scope of the appended claims.

What is claimed is:

1. A method of manufacturing a dual-gate CMOS structure, comprising:
    forming a first plate buried in an insulating layer such that a portion of the insulating layer provides a spacing between a top surface of the insulating layer and the first plate;
    while the portion of the insulating layer is arranged over the first plate, forming a second plate above the portion of the insulating layer electrically corresponding to the first plate;
    providing an isolation structure between the first plate and the second plate; and
    doping the isolation structure to form diffusion regions between the first plate and the second plate, wherein:
        the isolation structure includes a dielectric layer surrounding a silicon island and in contact with the insulating layer, and
        the insulating layer forms a back plate insulating structure between the first plate and the silicon island.

2. The method of claim 1, wherein the isolation structure forms the dielectric layer above the first plate.

3. The method of claim 1, wherein the isolation structure is approximately 50 Å to 400 Å thick.

4. The method of claim 1, wherein a height of either of the first plate and the second plate is approximately 1000 Å to 2000 Å.

5. The method of claim 1, wherein the dielectric layer is thermally grown on the silicon island.

6. The method of claim 1 wherein the dielectric layer and the back plate insulating structure are each approximately 10 Å to 100 Å thick.

7. The method of claim 1, further comprising:
    forming a first terminal connected to the first plate and to opposing sides of the silicon island using diffusion regions formed on the silicon island; and
    forming a second terminal connected to the second plate.

8. The method of claim 1, further comprising:
    forming a first terminal connected to opposing sides of the silicon island at diffusions regions; and
    forming a second terminal connected to the first plate and the second plate.

9. The method of claim 1, further comprising:
    forming a first terminal connected to the silicon island;
    forming a second terminal connected to the first plate;
    forming a third terminal connected to the second plate; and
    providing a higher potential to the first terminal than the second terminal or the third terminal.

10. The method of claim 1, wherein the isolation structure is formed from a silicon layer which is entirely etched away between the first plate and the second plate such that the second plate is formed directly on the insulating layer and further comprising:
    forming a first terminal connected to the first plate; and
    forming a second terminal connected to the second plate.

11. The method of claim 1, further comprising providing capacitance directly between the first plate and the second when the silicon body between the plates is fully-depleted.

12. The method of claim 1, further comprising:
    forming an inversion layer beneath a top portion of the insulating layers when a potential of a wire shorting between diffusion regions formed on the isolation structure with respect to one diffusion region of the diffusion regions causes channel inversion; and
    forming an accumulation layer beneath the top portion of the insulating layers when the potential of the wire is high with respect to the one diffusion region.

13. The method of claim 1, further comprising:
    forming at least another plate in the insulating layer;
    forming at least another plate above the insulating layer corresponding to the at least another plate in the insulating layer; and
    providing an isolation island and dielectric structure between the at least another plate in the insulating layer and above the insulating layer.

14. The method of claim 1, wherein the dielectric layer is formed to expose portions of the insulating layer.

15. A method of manufacturing a dual-gate CMOS structure, comprising:
    forming at least one back plate in an insulating layer such that a portion of the insulating layer provides a spacing between a top surface of the insulating layer and the at least one back plate;
    while the portion of the insulating layer is arranged over the at least one back plate, forming at least one front plate above the portion of the insulating layer corresponding to the at least one back plate; and
    providing a dielectric structure between the at least one back plate and the front plate,
    wherein the dielectric structure is a back gate dielectric layer and a front gate dielectric layer, the front gate dielectric layer is formed between a silicon based island and the at least one front plate, and in contact with the back gate dielectric layer, and the dielectric structure surrounds the silicon based island.

16. The method of claim 15, further comprising doping an isolation island formed in the dielectric structure to form diffusion regions.

17. The method of claim 15, further comprising:
etching portions of the silicon layer to form isolated islands corresponding to the at least one back plate and the at least one front plate;
doping portions of the isolated islands to form diffusion regions, wherein the dielectric structure is a back gate dielectric layer provided between the back plate and the isolated islands, and a front gate dielectric formed between the isolated islands and the front plate.

18. The method of claim 15, further comprising doping diffusion regions associated with the at least one back plate and front plate.

19. The method of claim 15, wherein:
the dielectric is a first dielectric and a second dielectric both approximately 10 Å to 100 Å thick; and
the front plate and the back gate have a critical dimension of approximately 1000 Å to 2000 Å.

20. The method of claim 15, wherein the front gate dielectric layer is formed to expose portions of the insulating layer.

21. The method of claim 18, wherein the dielectric structure is a front plate dielectric and a back plate dielectric separated by diffusion regions.

22. The method of claim 21, further comprising:
forming a first terminal connected to the back plate and opposing sides of the diffusion regions to short the diffusion regions; and
forming a second terminal connected to the front plate.

23. The method of claim 21, further comprising:
forming a first terminal connected to the diffusions regions; and
forming a second terminal connected to the front plate and the back plate.

24. The method of claim 21, further comprising:
forming a first terminal connected to the one diffusion region of the diffusion regions;
forming a second terminal connected to the front plate; and
forming a third terminal connected to the back plate; and
providing a higher potential to the first terminal than the second terminal or the third terminal.

25. A method of manufacturing a dual-gate CMOS structure, comprising:
forming at least one back plate in an insulating layer such that a portion of the insulating layer provides a spacing between a top surface of the insulating layer and the at least one back plate;
while the portion of the insulating layer is arranged over the at least one back plate, forming at least one front plate above the portion of the insulating layer corresponding to the at least one back plate; and
providing a dielectric structure between the at least one back plate and the front plate, wherein:
the at least one back plate is at least two back plates;
the at least one front plate is at least two front plates; and
the dielectric structure contains a first dielectric and a second dielectric
wherein the dielectric structure is a back gate dielectric layer and a front gate dielectric layer, the front gate dielectric layer is formed between a silicon based island and the at least one front plate, and in contact with the back gate dielectric layer, and the dielectric structure surrounds the silicon based island.

26. The method of claim 25, wherein the two front gates are at least a first front gate and a second front gate, the first and second front gate being formed simultaneously in a same process.

27. The method of claim 25, wherein the two or more front gates are a first front gate and a second front gate, the first and second front gate being formed separately.

28. A method of manufacturing a dual-gate CMOS structure, comprising:
forming a first plate buried in an insulating layer such that a portion of the insulating layer provides a spacing between a top surface of the insulating layer and the first plate;
while the portion of the insulating layer is arranged over the first plate, forming a second plate above the spacing; and
providing an isolation structure between the first plate and the second plate, wherein:
the isolation structure includes a dielectric layer surrounding a silicon island and in contact with the insulating layer, and
the insulating layer forms a back plate insulating structure between the first plate and the silicon island.

29. The method of claim 28, wherein the method forms an ultra-thin SOI capacitor.

30. The method of claim 29, wherein the insulating layer comprises a BOX layer.

31. The method of claim 30, further comprising doping the isolation structure to form diffusion regions between the first plate and the second plate.

32. The method of claim 31, further comprising:
forming a first terminal; and
forming a second terminal connected to the first plate and the second plate.

* * * * *